(12) United States Patent
Sung et al.

(10) Patent No.: US 10,734,520 B2
(45) Date of Patent: Aug. 4, 2020

(54) MOS DEVICES HAVING EPITAXY REGIONS WITH REDUCED FACETS

(71) Applicant: Taiwan Semiconductor Manufacturing Company, Ltd., Hsinchu (TW)

(72) Inventors: Hsueh-Chang Sung, Zhubei (TW); Kun-Mu Li, Zhudong Township (TW); Tze-Liang Lee, Hsinchu (TW); Chii-Horng Li, Zhubei (TW); Tsz-Mei Kwok, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/592,050

(22) Filed: Oct. 3, 2019

(65) Prior Publication Data

US 2020/0035831 A1 Jan. 30, 2020

Related U.S. Application Data

(60) Continuation of application No. 16/113,876, filed on Aug. 27, 2018, now Pat. No. 10,475,926, which is a
(Continued)

(51) Int. Cl.
*H01L 29/78* (2006.01)
*H01L 29/66* (2006.01)
(Continued)

(52) U.S. Cl.
CPC .... *H01L 29/7848* (2013.01); *H01L 21/02057* (2013.01); *H01L 21/28* (2013.01);
(Continued)

(58) Field of Classification Search
CPC ............. H01L 29/165; H01L 29/66628; H01L 29/7848
(Continued)

(56) References Cited

U.S. PATENT DOCUMENTS 6,326,291 B1    12/2001  Yu
6,358,806 B1 *   3/2002  Puchner ................ H01L 21/268
                                                        257/E21.347
(Continued)

FOREIGN PATENT DOCUMENTS

| CN | 101425534 A | 5/2009 |
|---|---|---|
| KR | 19980042202 A | 9/1998 |
| KR | 20110093217 A | 8/2011 |

*Primary Examiner* — Matthew E Warren
(74) *Attorney, Agent, or Firm* — Slater Matsil, LLP (57) ABSTRACT

An integrated circuit structure includes a gate stack over a semiconductor substrate, and an opening extending into the semiconductor substrate, wherein the opening is adjacent to the gate stack. A first silicon germanium region is disposed in the opening, wherein the first silicon germanium region has a first germanium percentage. A second silicon germanium region is over the first silicon germanium region. The second silicon germanium region comprises a portion in the opening. The second silicon germanium region has a second germanium percentage greater than the first germanium percentage. A silicon cap substantially free from germanium is over the second silicon germanium region.

20 Claims, 11 Drawing Sheets

Related U.S. Application Data continuation of application No. 15/811,577, filed on Nov. 13, 2017, now Pat. No. 10,062,781, which is a continuation of application No. 15/607,135, filed on May 26, 2017, now Pat. No. 9,853,155, which is a continuation of application No. 14/955,187, filed on Dec. 1, 2015, now Pat. No. 9,666,686, which is a division of application No. 13/944,053, filed on Jul. 17, 2013, now Pat. No. 9,209,175.

(51) Int. Cl.

| | | |
|---|---|---|
| *H01L 29/165* | (2006.01) | |
| *H01L 21/8234* | (2006.01) | |
| *H01L 29/417* | (2006.01) | |
| *H01L 21/28* | (2006.01) | |
| *H01L 27/088* | (2006.01) | |
| *H01L 21/02* | (2006.01) | |
| *H01L 21/285* | (2006.01) | |
| *H01L 21/768* | (2006.01) | |

(52) U.S. Cl.
CPC .... *H01L 21/823425* (2013.01); *H01L 27/088* (2013.01); *H01L 29/165* (2013.01); *H01L 29/41766* (2013.01); *H01L 29/66492* (2013.01); *H01L 29/66628* (2013.01); *H01L 29/66636* (2013.01); *H01L 29/7834* (2013.01); *H01L 21/28518* (2013.01); *H01L 21/76843* (2013.01); *H01L 21/76855* (2013.01); *H01L 29/66545* (2013.01)

(58) Field of Classification Search
USPC .................................. 257/327, 377, 382, 384
See application file for complete search history.

(56) References Cited

U.S. PATENT DOCUMENTS

| | | | |
|---|---|---|---|
| 8,247,285 | B2 | 8/2012 | Lin et al. |
| 8,358,012 | B2 * | 1/2013 | Haran ............... H01L 21/28518 |
| | | | 257/382 |
| 2002/0043678 | A1 | 4/2002 | Shimazu et al. |
| 2004/0147082 | A1 | 7/2004 | Kim |
| 2006/0138398 | A1 | 6/2006 | Shimamune et al. |
| 2009/0108308 | A1 * | 4/2009 | Yang .................. H01L 29/66628 |
| | | | 257/288 |
| 2010/0207176 | A1 | 8/2010 | Hargrove et al. |
| 2011/0012197 | A1 * | 1/2011 | Hung ............... H01L 21/823807 |
| | | | 257/344 |
| 2011/0024804 | A1 | 2/2011 | Chang et al. |
| 2011/0147828 | A1 | 6/2011 | Murthy et al. |
| 2011/0201166 | A1 | 8/2011 | Chung et al. |
| 2011/0278676 | A1 | 11/2011 | Cheng et al. |
| 2012/0056245 | A1 * | 3/2012 | Kang ................. H01L 21/0245 |
| | | | 257/192 |
| 2012/0205715 | A1 | 8/2012 | Kwok et al. |
| 2013/0026538 | A1 * | 1/2013 | Liao ..................... H01L 29/165 |
| | | | 257/190 |
| 2013/0149830 | A1 | 6/2013 | Rhee et al. |
| 2014/0057399 | A1 | 2/2014 | Newbury et al. |
| 2015/0041852 | A1 | 2/2015 | Kwok et al. |

* cited by examiner

MOS DEVICES HAVING EPITAXY REGIONS WITH REDUCED FACETS

PRIORITY CLAIM AND CROSS-REFERENCE

This application is a continuation of U.S. application Ser. No. 16/113,876 filed on Aug. 27, 2018, which is a continuation of U.S. application Ser. No. 15/811,577 filed on Nov. 13, 2017 (now U.S. Pat. No. 10,062,781, issued Aug. 28, 2018), which is a continuation of U.S. application Ser. No. 15/607,135, filed on May 26, 2017 (now U.S. Pat. No. 9,853,155, issued Dec. 26, 2017), which is a continuation of U.S. application Ser. No. 14/955,187, filed Dec. 1, 2015 (now U.S. Pat. No. 9,666,686, issued May 30, 2017), which is a divisional of U.S. patent application Ser. No. 13/944,053, filed on Jul. 17, 2013 (now U.S. Pat. No. 9,209,175, issued Dec. 8, 2015), which applications are incorporated herein by reference.

BACKGROUND

Reduction of the size and the inherent features of semiconductor devices (e.g., Metal-Oxide Semiconductor (MOS) devices) has enabled continued improvement in speed, performance, density, and cost per unit function of integrated circuits over the past few decades. In accordance with a design of the MOS devices and one of the inherent characteristics thereof, modulating the length of a channel region underlying a gate between a source and drain of a MOS device alters a resistance associated with the channel region, thereby affecting a performance of the MOS device. More specifically, shortening the length of the channel region reduces a source-to-drain resistance of the MOS device, which, assuming other parameters are maintained relatively constant, may allow an increase in current flow between the source and drain when a sufficient voltage is applied to the gate of the MOS device.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A process for forming a Metal-Oxide-Semiconductor (MOS) device is provided in accordance with various exemplary embodiments. The intermediate stages of forming the MOS device are illustrated. The variations of the embodiments are discussed. Throughout the various views and illustrative embodiments, like reference numbers are used to designate like elements.

To enhance the performance of MOS devices, stress may be introduced in the channel region of a MOS device to improve carrier mobility. Generally, it is desirable to induce a tensile stress in the channel region of an n-type MOS ("NMOS") device in a source-to-drain direction, and to induce a compressive stress in the channel region of a p-type MOS ("PMOS") device in a source-to-drain direction.

One of the methods for applying compressive stress to the channel regions of PMOS devices is growing SiGe stressors in the source and drain regions. Such a method typically includes the steps of forming a gate stack on a semiconductor substrate, forming spacers on sidewalls of the gate stack, forming recesses in the silicon substrate along gate spacers, epitaxially growing SiGe stressors in the recesses, and annealing. Since SiGe has a lattice constant greater than that of silicon, it expands after annealing and applies a compressive stress to the channel region, which is located between a source SiGe stressor and a drain SiGe stressor.

Figure 1:
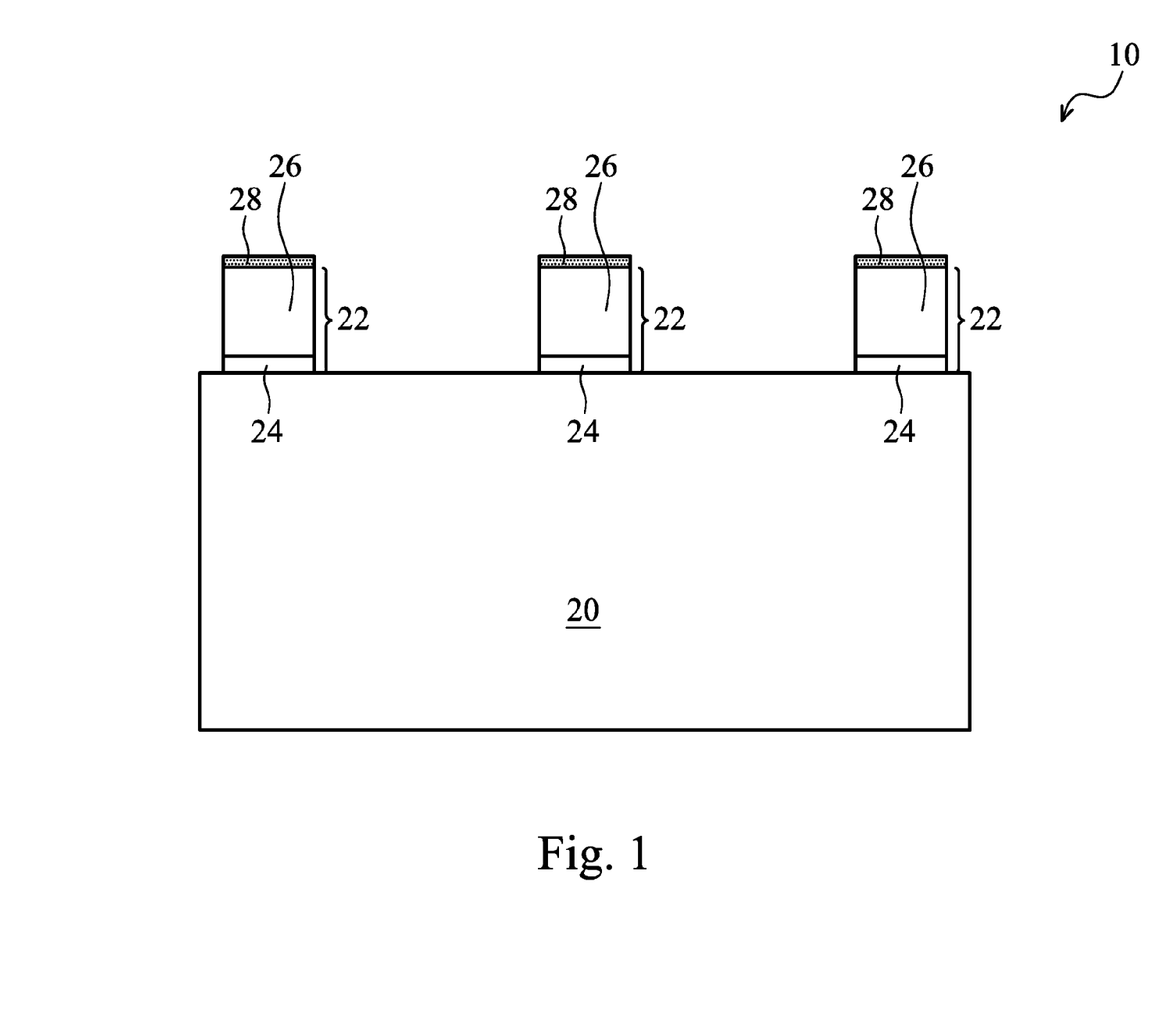
FIGS. 1 through 10 are cross-sectional views of intermediate stages in the manufacturing of a Metal-Oxide Semiconductor (MOS) device in accordance with some exemplary embodiments.

FIG. 1 illustrates substrate 20, which is a portion of wafer 10. Substrate 20 may be a bulk semiconductor substrate such as a silicon substrate, or may have a composite structure, such as a Silicon-On-Insulator (SOI) structure. Alternatively, other semiconductor materials that include group III, group IV, and/or group V elements may also be comprised in substrate 20, which semiconductor materials may include silicon germanium, silicon carbon, and/or III-V compound semiconductor materials.

Gate stacks 22 are formed over substrate 20, and include gate dielectrics 24 and gate electrodes 26. Gate dielectrics 24 may comprise silicon oxide and/or a high-k material having a high k value, for example, higher than about 7. Gate electrodes 26 may include commonly used conductive materials such as doped polysilicon, metals, metal silicides, metal nitrides, and combinations thereof. Gate stacks 22 may also include hard masks 28, which may comprise silicon nitride, for example, although other materials such as silicon carbide, silicon oxynitride, and the like may also be used. In the embodiments in which replacement gates are formed, hard mask 28 may be, or may not be, formed.

Figure 2:
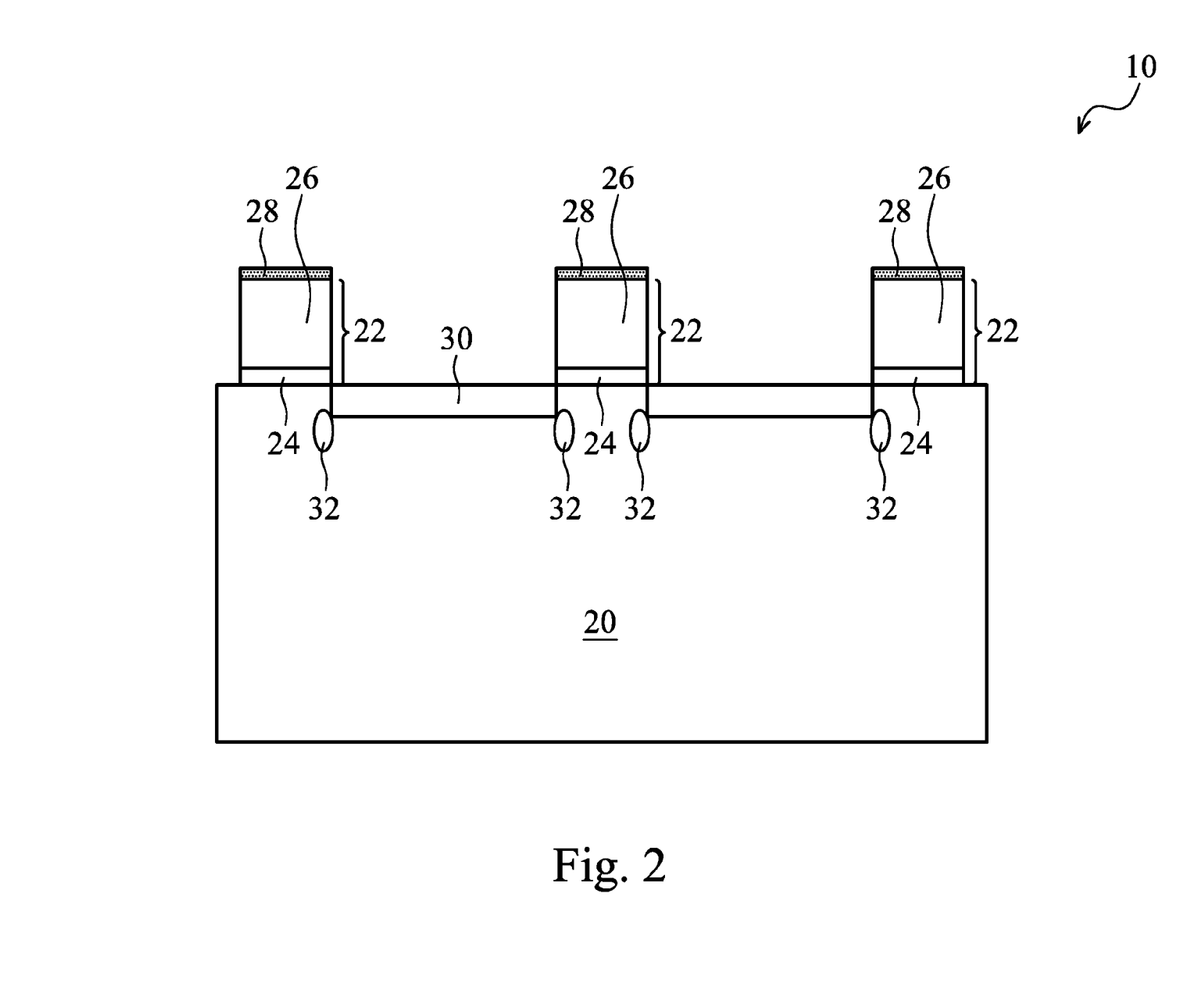

As shown in FIG. 2, Lightly Doped Drain/source (LDD) regions 30 are formed, for example, by implanting a p-type impurity such as boron and/or indium into substrate 20. Gate stacks 22 and hard masks 28 act as implantation masks so that the inner edges of LDD regions 30 are substantially aligned with the edges of gate stacks 22, respectively. The LDD implantation may be performed using energies between about 1 keV and about 10 keV, and a dosage between about $1 \times 10^{13}/cm^2$ and about $1 \times 10^{16}/cm^2$. It is appreciated, however, that the values recited throughout the description are merely examples, and may be changed to different values. The LDD implantation may be tilted or vertical, with the tilt angle between about 0 degree and about 30 degrees. In addition, pocket regions 32 may also be formed, for example, by implanting an n-type impurity such as arsenic, phosphorous, or the like into substrate 20. The pocket implantation may be performed using energies between about 20 keV and about 80 keV, and a dosage between about $1 \times 10^{12}/cm^2$ and about $1 \times 10^{14}/cm^2$. The pocket implantation may be tilted, with the tilt angle greater than the tilt angle of the LDD implantation. In some embodiments, the tilt angle of the pocket implantation is between about 15 degree and about 45 degrees.

Figure 3:
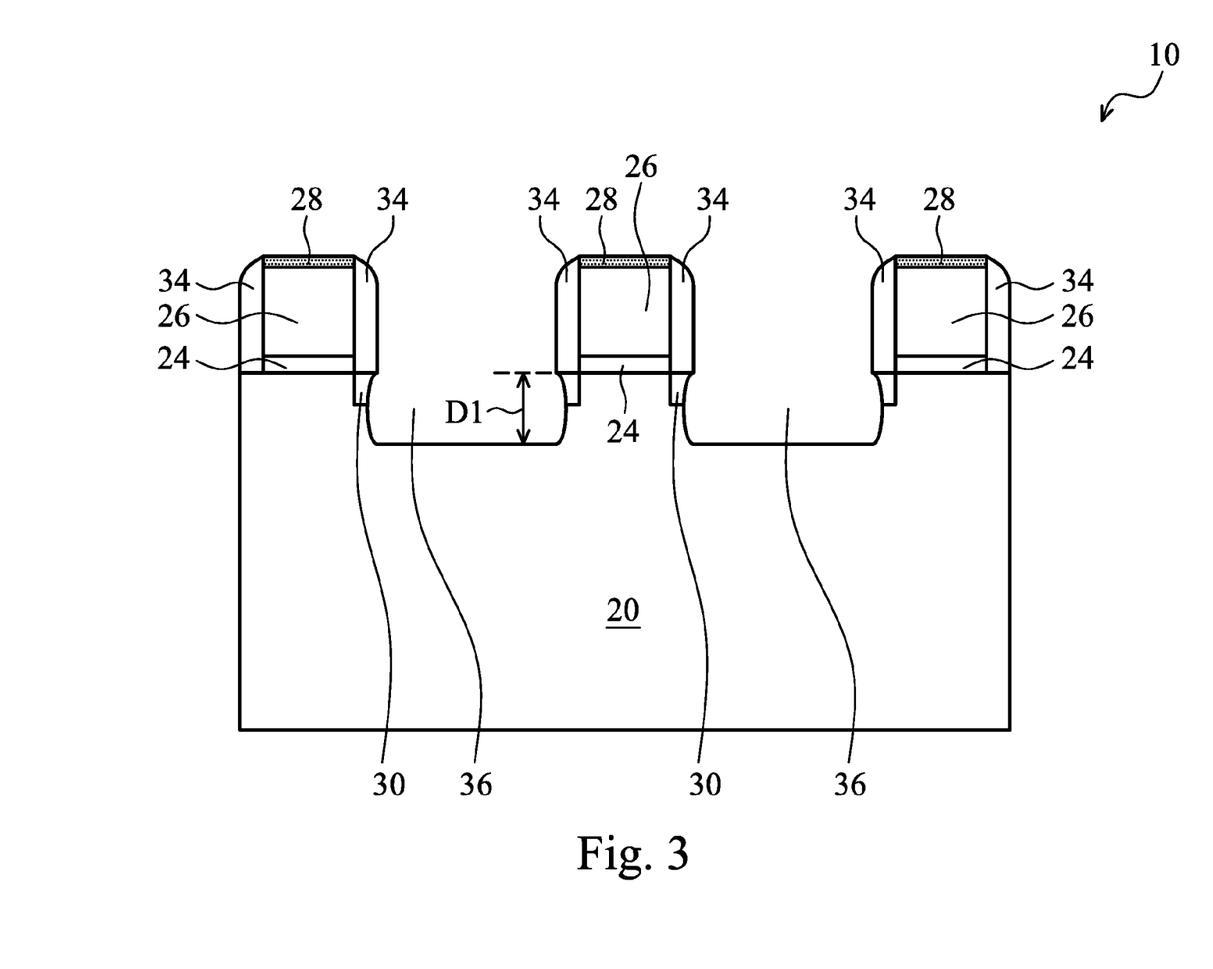

Referring to FIG. 3, gate spacers 34 are formed on the sidewalls of gate dielectrics 24 and gate electrodes 26. In some embodiments, each of gate spacers 34 includes a silicon oxide layer (not shown) and a silicon nitride layer over the silicon oxide layer, wherein the silicon oxide layer may have a thickness between about 15 Å and about 50 Å, and the thickness of the silicon nitride layer may be between about 50 Å and about 200 Å. In alternative embodiments, gate spacers 34 include one or more layers, each comprising silicon oxide, silicon nitride, silicon oxynitride, and/or other dielectric materials. The available formation methods include Plasma Enhanced Chemical Vapor Deposition (PECVD), Low-Pressure Chemical Vapor Deposition (LP-CVD), Sub-Atmospheric Chemical Vapor Deposition (SACVD), and other deposition methods.

As also shown in FIG. 3, an isotropic etch is performed to form openings 36 in substrate 20. The isotropic etch may be a dry etch, wherein the etching gas may be selected from $CF_4$, $Cl_2$, $NF_3$, $SF_6$, and combinations thereof. Depth D1 of opening 36 may be between about 150 Å and about 500 Å, for example.

Figure 4:
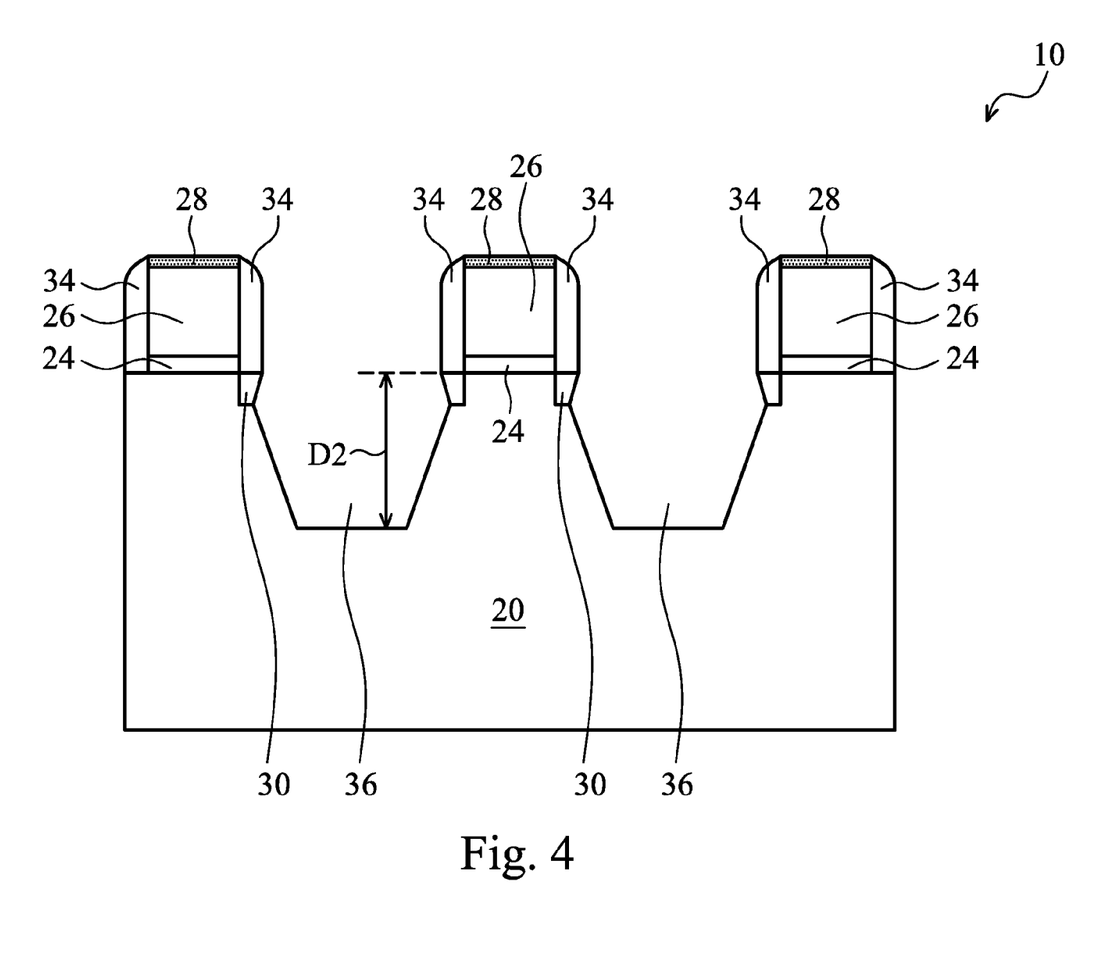

Next, as shown in FIG. 4, a wet etch is performed to expand openings 36, The wet etching may be performed, for example, using Tetra-Methyl Ammonium Hydroxide (TMAH), a potassium hydroxide (KOH) solution, or the like. In some exemplary embodiments, the TMAH solution has a concentration of between about 1 percent and about 30 percent. During the wet etch, the temperature of the TMAH may be between about 20° C. and about 100° C. After the wet etching, facets may be formed in openings 36, which facets include (111) planes of substrate 20. In some exemplary embodiments, after the wet etching, depth D2 of opening 36 may be between about 300 Å and about 800 Å, for example.

Figure 5:
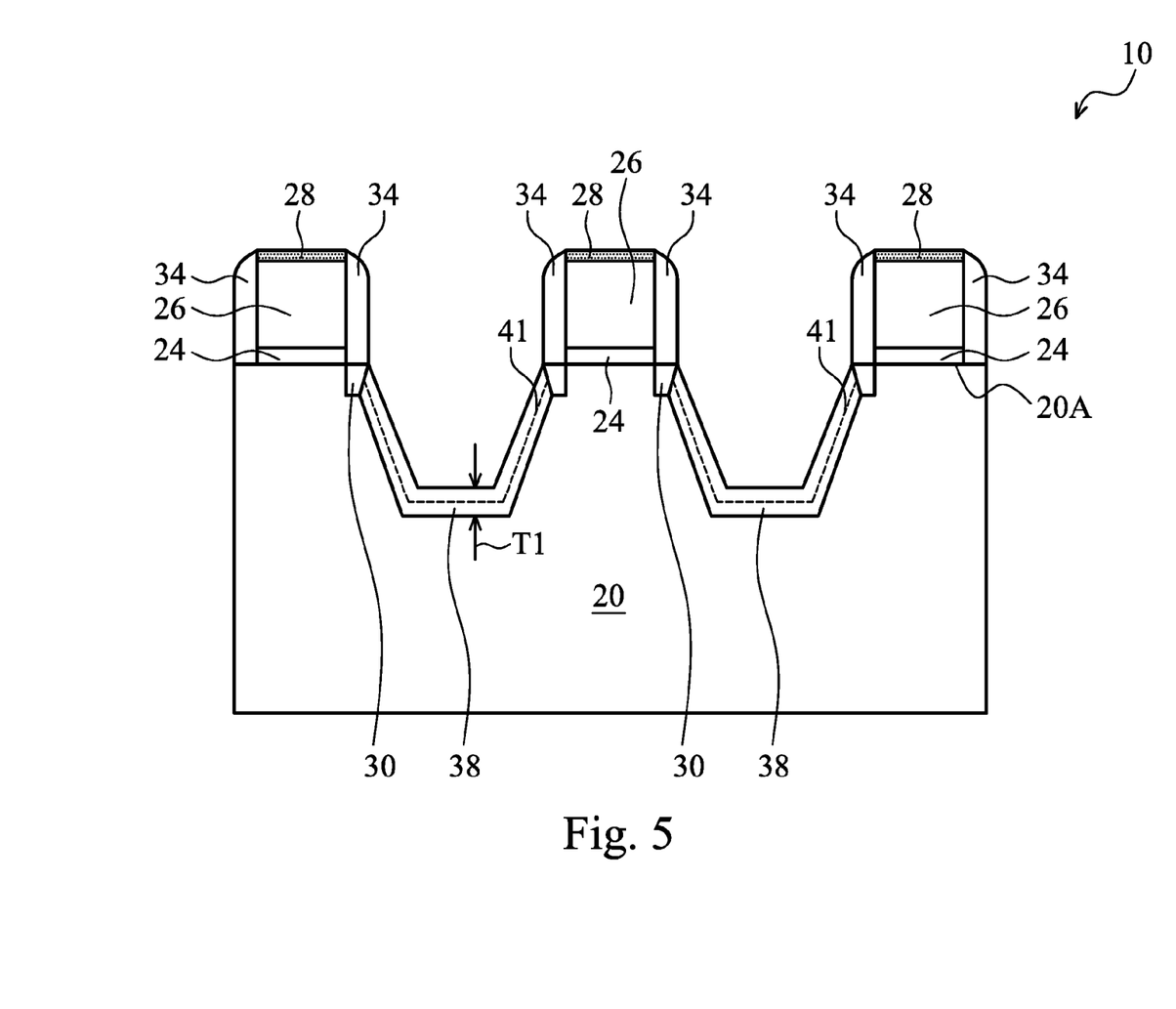

FIG. 5 illustrates the formation of epitaxy layers 38. Before the epitaxy, a pre-clean may be performed, for example, using an HF-based gas or a SiCoNi-based gas. The pre-clean may remove any undesirable silicon oxide that is formed as a result of the nature oxidation of the exposed surfaces in openings 36. In some embodiments, a high-temperature baking is performed. In alternative embodiments, the baking step is skipped. The high-temperature baking may be performed with or without the presence of HCl gas. The baking temperature may be between about 700° C. and about 900° C. The pressure of baking may be between about 10 torr and about 200 torr. The baking duration may be between about 30 seconds and about 4 minutes, for example. The high-temperature baking may also remove the f on the exposed surfaces of substrate 20, which exposed surfaces are in openings 36.

As shown in FIG. 5, a semiconductor material, such as silicon germanium (SiGe), is epitaxially grown in openings 36 through Selective Epitaxial Growth (SEG), forming epitaxy layers 38. Hence, throughout the description, epitaxy layers 38 are also referred to as SiGe layers 38. The process gases may include $H_2$, $N_2$, dichloro-silane (DCS), $SiH_4$, $GeH_4$, and/or the like. The temperature of the epitaxy may be between about 600° C. and about 900° C. In some embodiments, an etching gas is added to promote the selective growth on the exposed surfaces of substrate 20, but not on dielectrics such as gate spacers 34 and hard masks 28. The pressure of the process gases may be between about 10 torr and about 200 torr. The resulting thickness T1 of SiGe layers 38 may be between about 100 Å and about 400 Å, for example.

During the epitaxy, desired p-type impurities may be doped while the growth proceeds. For example, when boron is to be doped, $B_2H_6$ may be included in the process gases. In some embodiments, the impurity concentration of p-type impurities such as boron in epitaxy layers 38 is lower than about $1E19/cm^3$, and may be between about $1E18/cm^3$ and about $1E20/cm^3$. In alternative embodiments, during the epitaxy of layers 38, no p-type impurity is added. Epitaxy layers 38 may have a first germanium atomic percentage between about 10 percent and about 30 percent, for example, although different germanium percentages may also be used.

Figure 6:
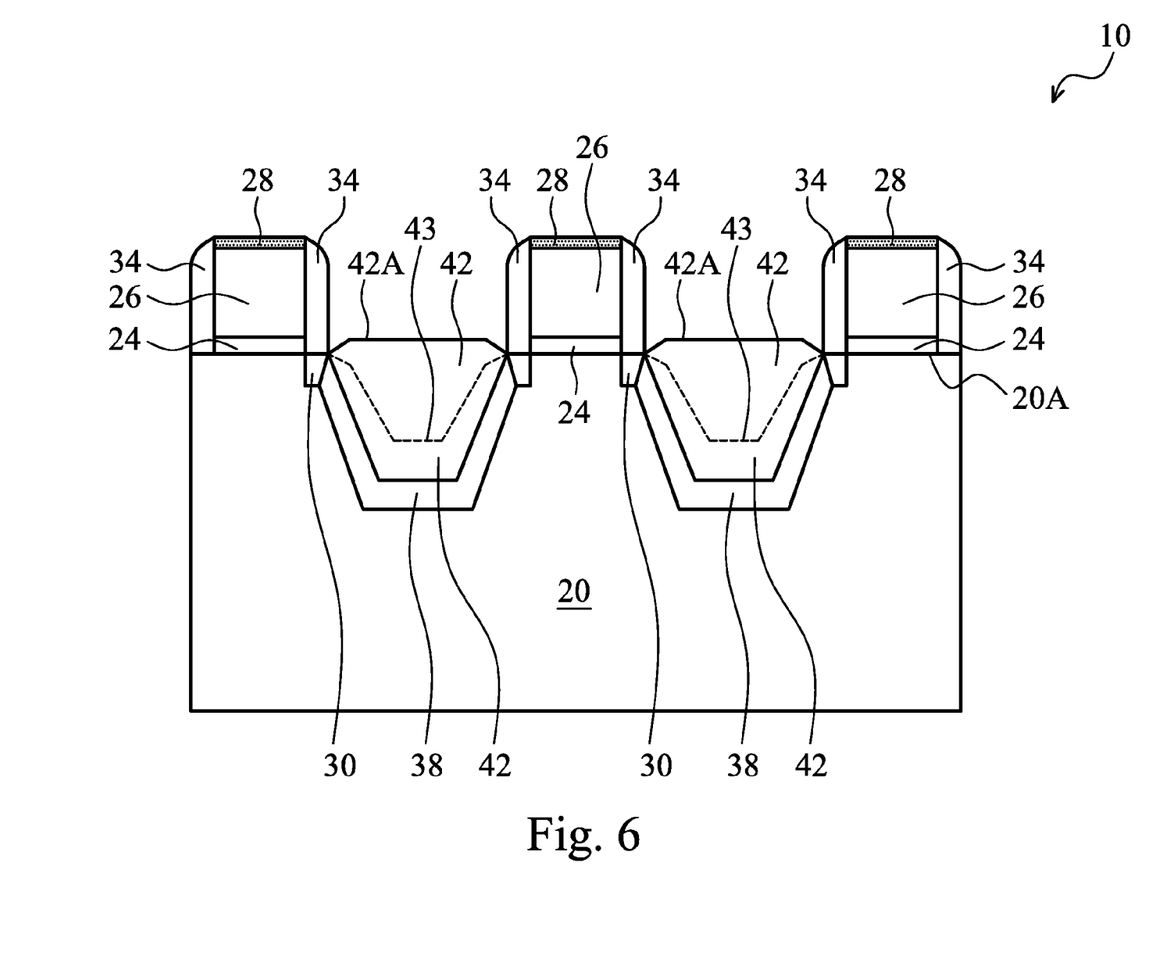

Referring to FIG. 6, epitaxy layers 42 are grown through an epitaxy. Epitaxy layers 42 may have a composition (the elements contained therein and the percentages of the elements) different from the composition of epitaxy layers 38. In some embodiments, epitaxy layers 42 are SiGe layers, which have a germanium percentage higher than the germanium percentage in epitaxy layers 38. For example, epitaxy layers 42 may have a second germanium atomic percentage between about 30 percent and about 60 percent. The process conditions for forming epitaxy layers 42 may be similar to the process conditions for forming epitaxy layers 38, except that the ratios of silicon containing gases and germanium containing gases are adjusted. In some embodiments, the top surfaces 42A of epitaxy layers 42 are higher than the top surface 20A of substrate 20. Epitaxy layers 38 and 42 in combination form parts of the source or drain region (and also the source or drain stressor) of a MOS device, which also includes one of gate stacks 22 as its gate.

Furthermore, during the epitaxy, a p-type impurity such as boron may be in-situ doped with the proceeding of the epitaxy. The p-type impurity concentration C42 in epitaxy layers 42 may be higher than the p-type impurity concentration in epitaxy layers 38. For example, p-type impurity concentration C42 is between about $1E20/cm^3$ and about $8E20/cm^3$.

Epitaxy layers 42 may also include a lower layer and an upper layer with different germanium percentages, wherein each of the lower layer and the upper layer has a substantially uniform germanium percentage. FIG. 6 schematically illustrate dashed lines 43 to mark the interface between the upper and the lower layer of epitaxy layers 42. Furthermore, the germanium percentage G42A in the upper layer may be higher than the germanium percentage G42B in the lower layer. For example, germanium percentage G42A may be greater than about 45 percent, and germanium percentage difference (G42A-G42B) may be greater than about 10 percent in some embodiments.

In some embodiments, in each of epitaxy layers 38 and 42, the germanium percentage is substantially uniform. In alternative embodiments, either one or both of epitaxy layers 38 and 42 has a gradually and continuously changed germanium percentage. During the respective epitaxy, the flow rate of the germanium-containing precursor (such as $GeH_4$) may be gradually and continuously increased. In these embodiments, in the layer in which the germanium percentage gradually changes, the lower portions of the layer have germanium percentages lower than the germanium percentages of the upper layers.

Figure 7:
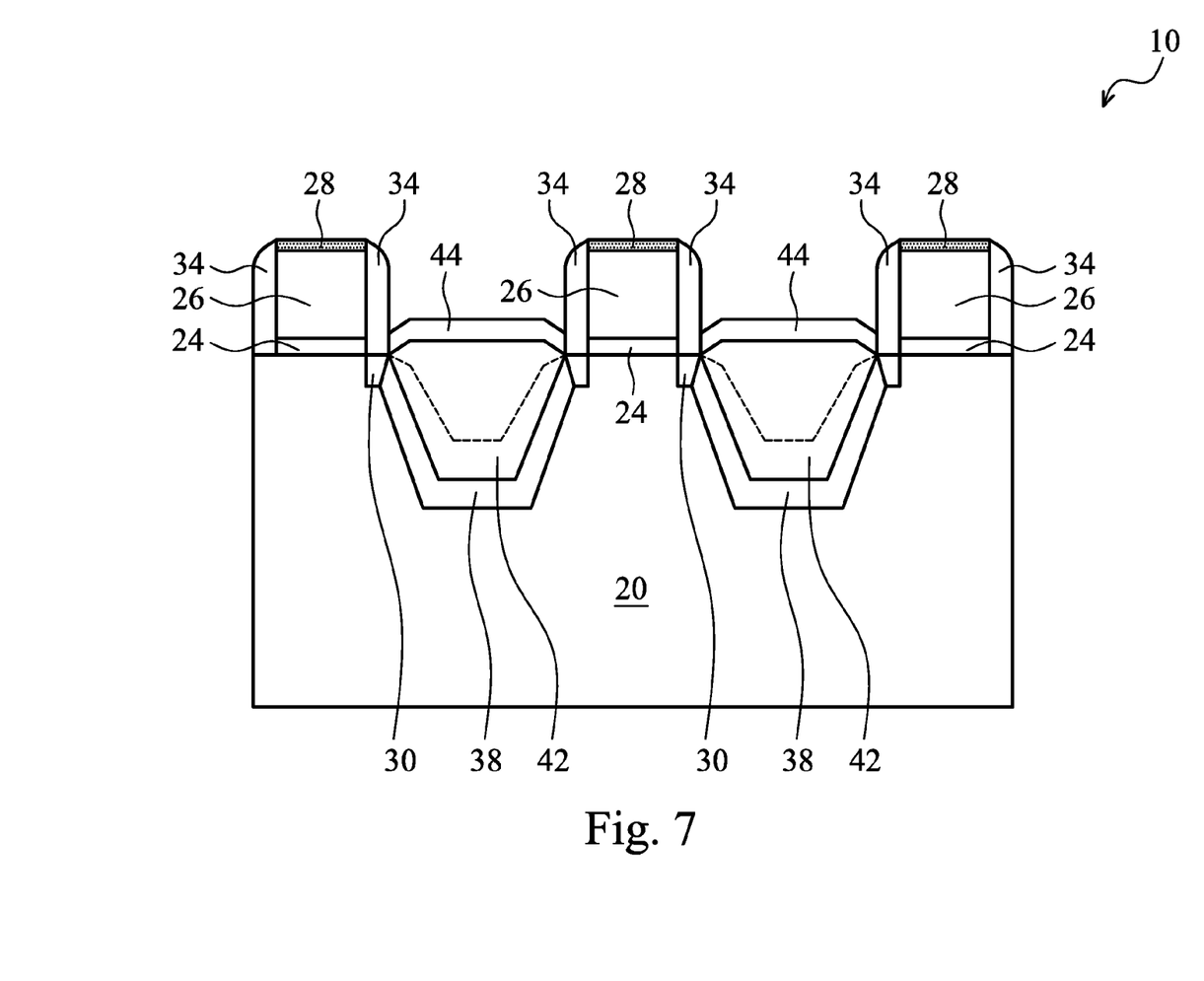

After the formation of epitaxy layers 42, capping layers 44 are formed through epitaxy, as shown in FIG. 7. Capping layers 44 may have a composition (including the elements contained therein and the percentages of the elements) different from the composition of epitaxy layers 42. Capping layers 44 may be pure silicon layers with no germanium comprised therein, or substantially pure silicon layers with, for example, less than 2 percent, or one percent, germanium. Accordingly, capping layers 44 are alternatively referred to as silicon caps throughout the description. Capping layers 44 may also be SiGe layers, with the germanium concentration in capping layers 44 lower than the germanium concentration in epitaxy layers 42. The top portion of epitaxy layer 42 that is in contact with capping layer 44 may have the highest germanium percentage in all portions of epitaxy layers 42 and 44 and/or the source/drain regions of the respective MOS device.

During the epitaxy of capping layer 44, a p-type impurity such as boron may be in-situ doped with the proceeding of the epitaxy. In some embodiments, the concentration of the p-type impurity in capping layers 44 is higher than the p-type impurity concentration in epitaxy layers 42 and 38. In some embodiments, a ratio of the p-type impurity concentration C44 in capping layers 44 to the p-type impurity concentration C42 in epitaxy layers 42 is greater than about 10. Ratio C44/C42 may also be between about 5 and about 15. In some embodiments, p-type impurity concentration C44 is between about 1E21 and about $8E21/cm^3$. The growth of epitaxy layers 38, 42, and 44 may be in-situ performed in a same chamber, with no vacuum break therein.

Figure 8:
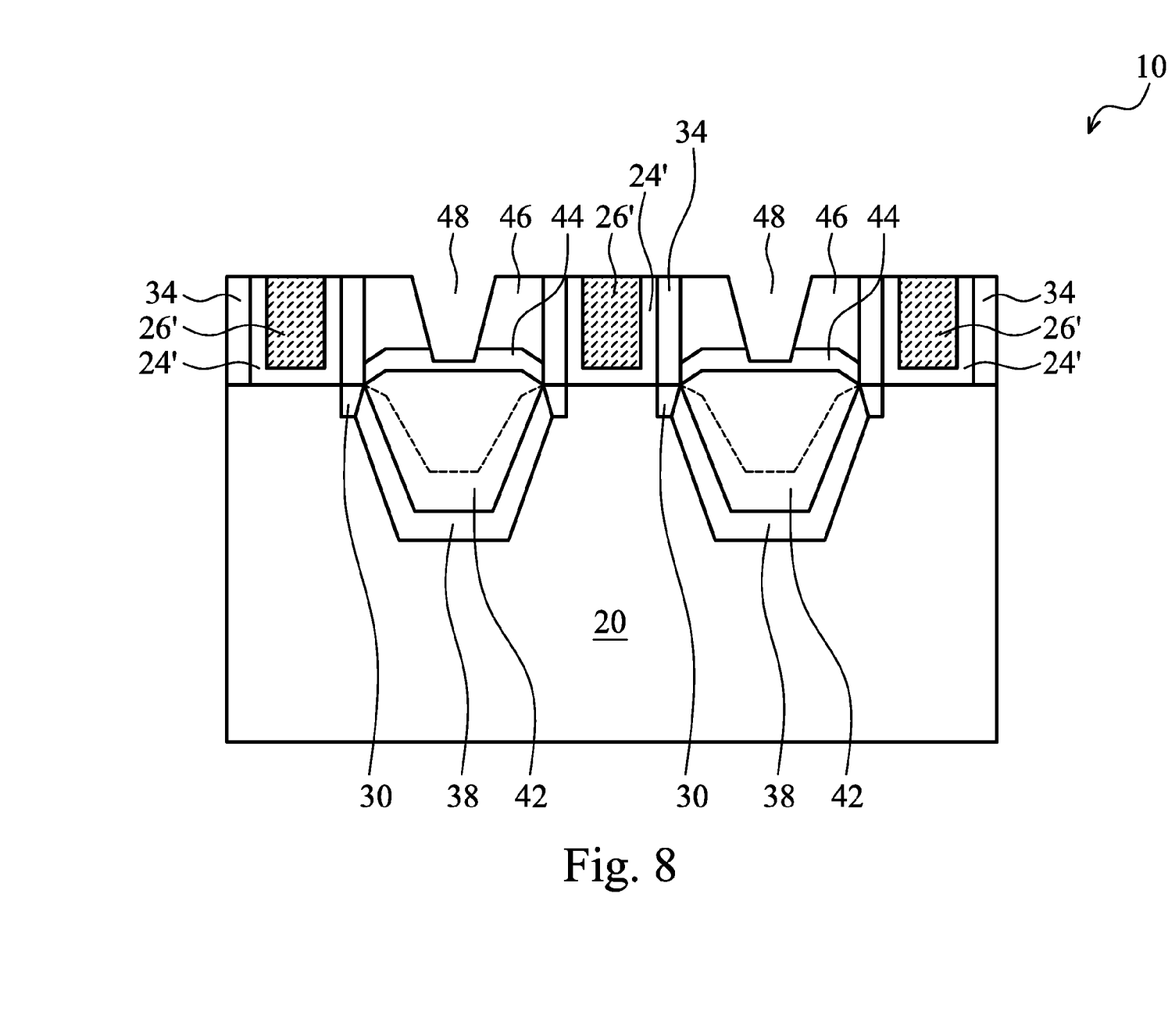

Next, referring to FIG. 8, hard masks 28, if any, are removed, and replacement gates are formed to replace gate dielectrics 24 and gate electrodes 26 in accordance with some embodiments. In alternative embodiments, gate dielectrics 24 and gate electrodes 26 (FIG. 7) are not replaced with replacement gates. In the embodiments replacement gates are formed, gate dielectrics 24 and gate electrodes 26 act as dummy gates. FIG. 8 illustrates an exemplary structure including the replacement gates. The formation process may include forming Inter-Layer Dielectric (ILD) 46, performing a CMP to level the top surfaces of ILD 46 with the top surface of gate electrodes 26 or hard mask 28 (if any), and removing the dummy gates. A gate dielectric layer and a gate electrode layer may then be formed to fill the openings left by the removed dummy gates, followed by a CMP to remove excess portions of the gate dielectric layer and the gate electrode layer. The remaining replacement gates include gate dielectrics 24' and gate electrodes 26'. Gate dielectrics 24' may comprise a high-k dielectric material with a k value greater than about 7.0, for example, and gate electrodes 26' may comprise a metal or a metal alloy. ILD 46 may be formed of a dielectric material such as Phospho-Silicate Glass (PSG), Boro-Silicate Glass (BSG), Boron-Doped Phospho-Silicate Glass (BPSG), or the like. Next, contact openings 48 are formed, exposing underlying capping layers 44.

Figure 9:
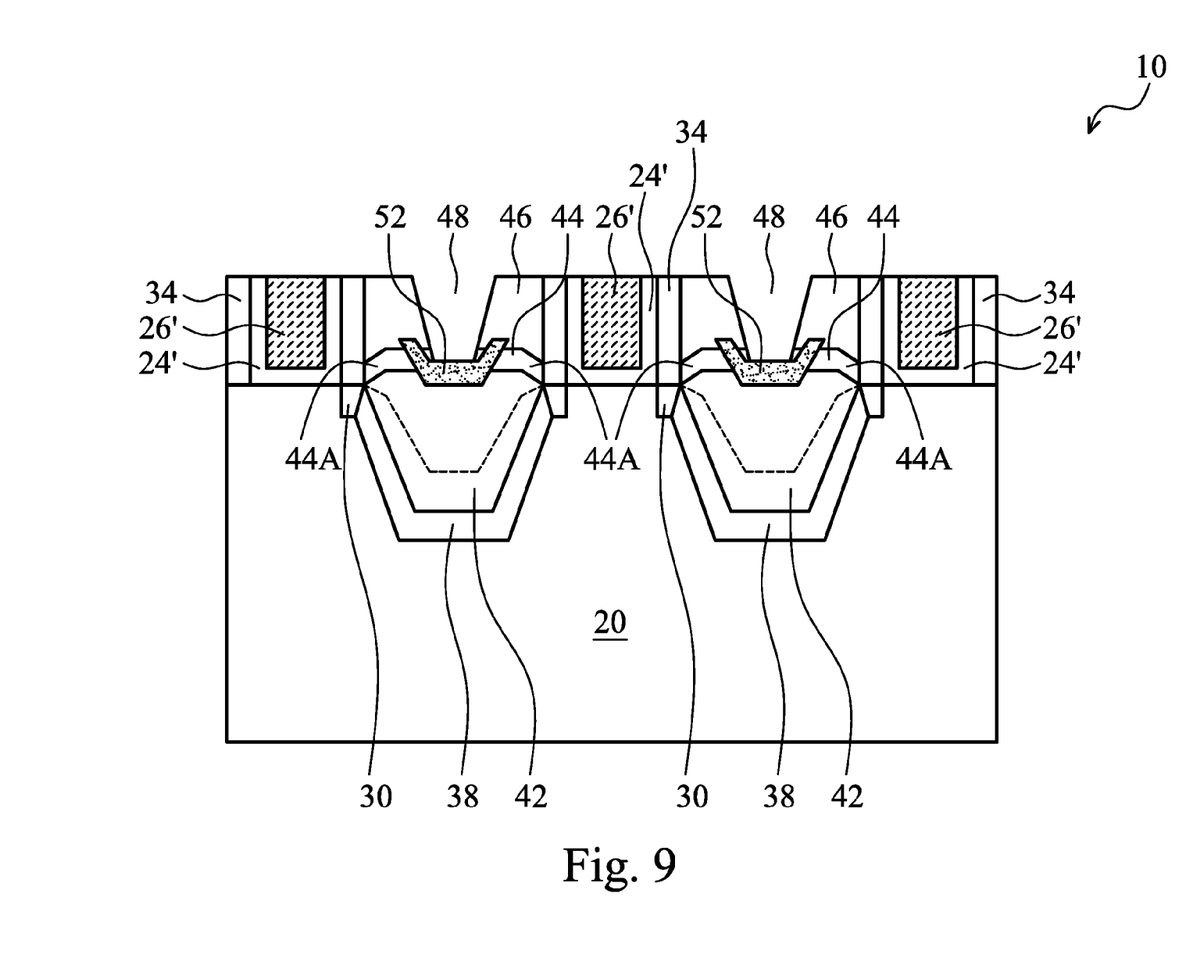

FIG. 9 illustrates the formation of source/drain silicide regions 52. Silicide regions 52 may be formed by depositing a thin layer (not shown) of a silicide metal, such as titanium, cobalt, nickel, tungsten, or the like, over the devices, including the exposed surfaces of capping layers 44. After the reaction, a layer of metal silicide is formed between silicon and the metal. The un-reacted metal is selectively removed through the use of an etchant that attacks metal but does not attack silicide. As a result of the silicidation, source/drain silicide regions 52 extend into capping layers 44, and may extend into epitaxy layers 42. Alternatively, the top portions of capping layers 44 are silicided, and the bottom portions of capping layers 44 are not silicided. After silicidation, there may be some portions 44A of capping layers 44 remaining not silicided, wherein portions 44A is level with, and are on the opposite sides of, source/drain silicide regions 52.

Figure 10:
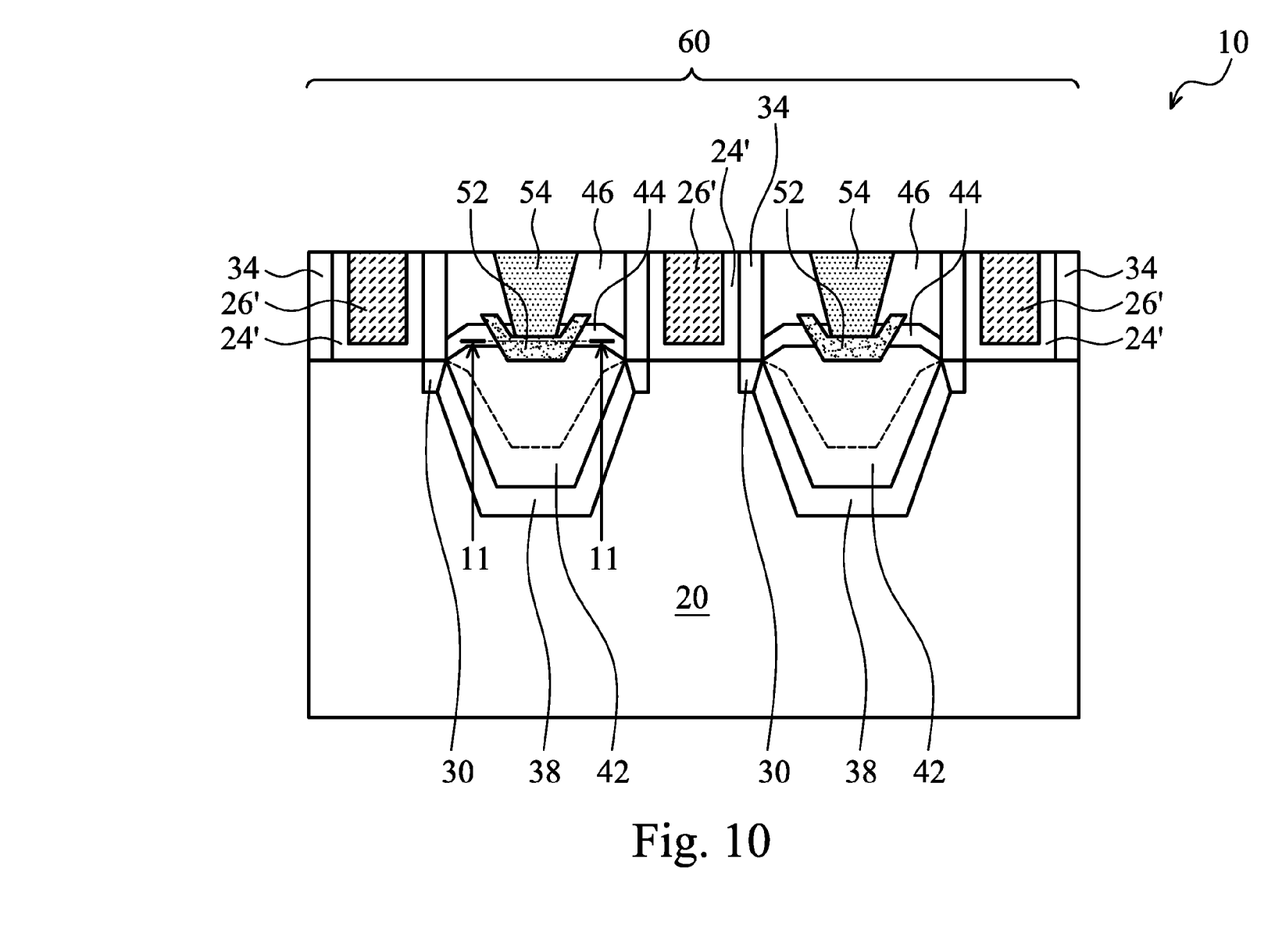

FIG. 10 illustrates the formation of source/drain contact plugs 54, which are formed by filling a conductive material such as tungsten, copper, aluminum, titanium, cobalt, silicon, germanium, and/or the like, into openings 48, and performing a CMP to level the top surface of contact plugs 54 with the top surface of ILD 46. MOS transistor 60 is thus formed, which includes epitaxy layers 38, 42, and possibly remaining portions of capping layers 44 as the source and drain regions.

Figure 11:
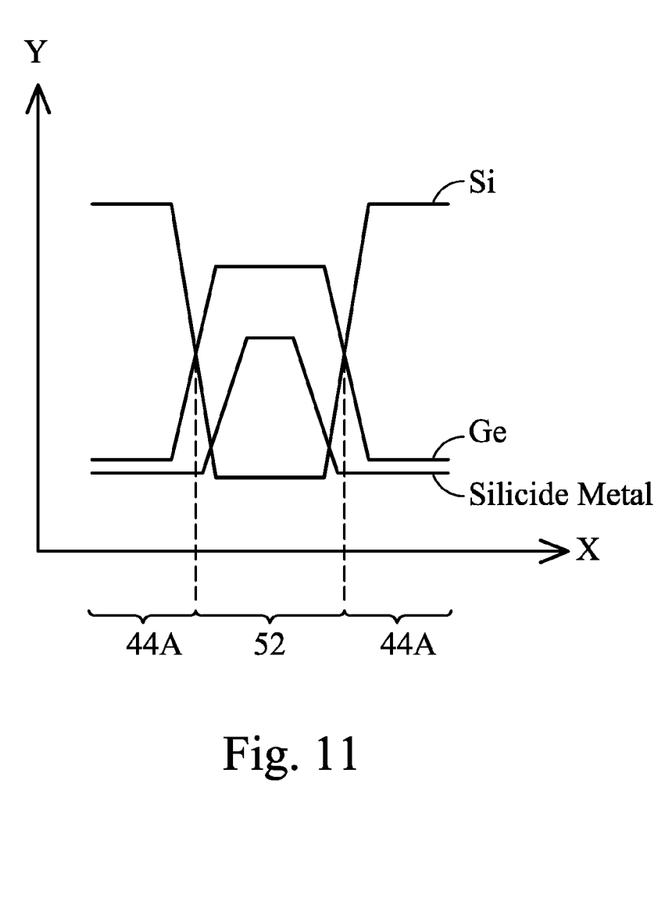
FIG. 11 schematically illustrates the profiles of some elements comprised in the MOS device in accordance with some alternative exemplary embodiments.

FIG. 11 schematically illustrates the profiles of several elements in MOS transistor 60, wherein the profiles are obtained from the horizontal plane containing lines 11-11 in FIG. 10. The horizontal plane is at a level immediately above the interface between capping layer 44 and the respective underlying epitaxy layer 42. The respective regions 44A and 52 are also illustrated in FIG. 11. The X-axis illustrates the distance from the left end of line 11-11 in FIG. 10. The Y-axis indicates the schematic percentages of silicon, germanium, and the silicide metal. As shown in FIG. 11, portions 44A have the highest silicon percentages, which can be as high as 100 percent. In silicide regions 52, the percentage of silicon is reduced. Conversely, germanium may have very low percentages (which can be as low as zero percent) in regions 44A. In silicide regions 52, the percentage of germanium is higher, which may be caused by the inter-diffusion in the silicidation. The silicide metal may have very low percentage (which can be as low as zero percent) in regions 44A. In silicide regions 52, the percentage of the silicide metal is higher.

In the embodiments of the present disclosure, by forming low-germanium-containing capping layers, the facets that are formed on germanium epitaxy regions is reduced since silicon has the tendency of able to be formed close to gate spacers, while germanium is expelled by gate spacers, hence forming severe facets. The facets result in the reduction in the landing area of source/drain contact plugs, hence higher contact resistance. Furthermore, with facets, the silicide metal may have extrusions to penetrate to LDD regions. In the embodiments of the present disclosure, these problems are at least reduced, and sometimes eliminated.

In accordance with some embodiments, an integrated circuit structure includes a gate stack over a semiconductor substrate, and an opening extending into the semiconductor substrate, wherein the opening is adjacent to the gate stack. A first silicon germanium region is disposed in the opening, wherein the first silicon germanium region has a first germanium percentage. A second silicon germanium region is over the first silicon germanium region. The second silicon germanium region comprises a portion in the opening. The second silicon germanium region has a second germanium percentage greater than the first germanium percentage. A silicon cap substantially free from germanium is over the second silicon germanium region.

In accordance with other embodiments, an integrated circuit structure includes a semiconductor substrate, and a gate stack over the semiconductor substrate, wherein the gate stack is comprised in a MOS device. A source/drain region of the MOS device extends into the semiconductor substrate. The source/drain region includes a first silicon germanium region, wherein the first silicon germanium region has a first germanium percentage, and a second silicon germanium region over the first silicon germanium region. The second silicon germanium region has a second germanium percentage greater than the first germanium percentage. The second silicon germanium region includes a top portion having a highest germanium percentage among the source/drain region. A silicon cap is overlying and contacting the top portion of the second silicon germanium region.

In accordance with yet other embodiments, a method includes forming a gate stack over a semiconductor substrate, forming an opening extending into the semiconductor substrate, wherein the opening is on a side of the gate stack, and performing a first epitaxy to grow a first silicon germanium region in the opening. The first silicon germanium region has a first germanium percentage. A second epitaxy is performed to grow a second silicon germanium region over the first silicon germanium region, wherein the second silicon germanium region has a second germanium percentage greater than the first germanium percentage. A third epitaxy is performed to grow a silicon cap substantially free from germanium over the second silicon germanium region. The method further includes forming a silicide region extending into the silicon cap, wherein the silicide region includes a higher a germanium percentage than the silicon cap.

In accordance with another embodiment, a method includes patterning a first opening in a semiconductor substrate, epitaxially growing a first epitaxy region in the first opening, and epitaxially growing a second epitaxy region on the first epitaxy region. The second epitaxy region includes a lower germanium percentage than the first epitaxy region. The method further includes depositing an inter-layer dielectric (ILD) over the second epitaxy region, patterning a second opening in the ILD, and exposing a portion of the second epitaxy region. A silicidation is performed on the portion of the second epitaxy region to form a silicide region. The silicide region further extends into the first epitaxy region.

In accordance with yet another embodiment, a method includes etching an opening in a semiconductor substrate between adjacent gate spacers, forming a first semiconductor region in the opening using a first epitaxy process, and forming a second semiconductor region over the first semiconductor region using a second epitaxy process. The second epitaxy process includes using a higher percentage of germanium gases than the first epitaxy process. The method further includes forming a capping region over the second semiconductor region using a third epitaxy process. The third epitaxy process includes using a lower percentage of germanium gases than the second epitaxy process. The method further includes depositing a dielectric layer between the adjacent gate spacers and over the capping region, exposing the capping region, and after exposing the capping region forming a silicide region extending through the capping region. The silicide region includes a higher percentage of germanium than the capping region. A contact is formed extending through the dielectric layer and contacting the silicide region.

In accordance with an embodiment, an integrated circuit structure including a semiconductor substrate; a gate stack over the semiconductor substrate; a first silicon germanium region having a first germanium percentage and disposed in the semiconductor substrate adjacent the gate stack; a capping layer over the first silicon germanium region; and a silicide region extending into the capping layer. The capping layer has a lower germanium percentage than the first silicon germanium region, and the silicide region comprises a higher a germanium percentage than the capping layer.

In accordance with an embodiment, a semiconductor device includes a semiconductor substrate and a transistor at a top surface of the semiconductor substrate. The transistor includes a gate stack and a source/drain region having a first germanium-containing semiconductor region; a second germanium-containing semiconductor region on the first germanium-containing semiconductor region, wherein the second germanium-containing semiconductor region has a higher germanium percentage than the first germanium-containing semiconductor region; and a capping layer on the second germanium-containing semiconductor region, wherein the capping layer has a lower germanium percentage than the second germanium-containing semiconductor region. The semiconductor device further includes a silicide region extending into the capping layer. A line parallel to a major surface of the semiconductor substrate extends from a first portion of the capping layer through the silicide region to a second portion of the capping layer, and a germanium percentage of the silicide region is greater than a silicon percentage of the silicide region.

In accordance with an embodiment, transistor includes gate stack and a source/drain region comprising a first silicon germanium region having a first germanium percentage; a second silicon germanium region over the first silicon germanium region and having a second germanium percentage greater than the first germanium percentage; a capping layer over the second silicon germanium region, wherein a germanium percentage throughout the source/drain region is highest at an interface between the second silicon germanium region and the capping layer; and a silicide extending into at least the capping layer. The silicide comprises a higher germanium percentage than the capping layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device comprising:
    a gate structure at a top surface of a semiconductor substrate;
    a source/drain region adjacent the gate structure, the source/drain region comprising:
        a first germanium comprising region;
        a silicon germanium cap over the first germanium comprising region and above the semiconductor substrate, the silicon germanium cap having a lower germanium percentage than the first germanium comprising region; and
    a silicide extending through the silicon germanium cap, wherein the silicide has a higher germanium percentage than the silicon germanium cap, and at least a portion of the silicide has a higher germanium percentage than a silicon percentage.

2. The semiconductor device of claim 1 further comprising a second germanium comprising region under the first germanium comprising region, wherein the second germanium comprising region has a lower germanium concentration than the first germanium comprising region.

3. The semiconductor device of claim 2, wherein the first germanium comprising region contacts the silicon germanium cap, and wherein a portion of the first germanium comprising region in contact with the silicon germanium cap has a highest germanium percentage among the first and the second germanium comprising regions.

4. The semiconductor device of claim 1 further comprising, wherein the silicide extends into the first germanium comprising region.

5. The semiconductor device of claim 1 further comprising a contact contacting a top of the silicide, wherein a portion of the silicon germanium cap is between a side of the silicide and the contact.

6. The semiconductor device of claim 1 further comprising a p-type impurity in the silicon germanium cap.

7. The semiconductor device of claim 1, wherein the silicon germanium cap comprises less than 2% germanium.

8. A PMOS transistor comprising:
   a gate stack at a top surface of a semiconductor substrate; and
   a source/drain region, the source/drain region comprising:
      a lower portion having a first germanium percentage; and
      an upper portion over the lower portion of the source/drain region and having a second germanium percentage greater than the first germanium percentage;
   a capping layer over the source/drain region, wherein the capping layer has a third germanium percentage lower than the second germanium percentage; and
   a silicide spanning across a boundary between the capping layer and the source/drain region, wherein the silicide has a fourth germanium percentage greater than the third germanium percentage.

9. The PMOS transistor of claim 8, wherein a germanium percentage of the source/drain region gradually increases in a direction from the lower portion to the upper portion.

10. The PMOS transistor of claim 8, wherein the second germanium percentage is at least 45 percent.

11. The PMOS transistor of claim 8, wherein the third germanium percentage is lower than the first germanium percentage.

12. The PMOS transistor of claim 8, wherein a germanium percentage of the silicide is greater than a silicon percentage of the silicide.

13. The PMOS transistor of claim 8, wherein the silicide extends through the capping layer.

14. The PMOS transistor of claim 8 further comprising a p-type impurity in the capping layer, wherein a p-type impurity concentration in the capping layer is higher than a p-type impurity concentration in upper portion of the source/drain region or the lower portion of the source/drain region.

15. A semiconductor device comprising:
   a semiconductor substrate;
   a gate stack on the semiconductor substrate;
   an epitaxial region adjacent the gate stack;
   a capping layer over the epitaxial region;
   a silicide extending from a top surface of the capping layer into the epitaxial region, the silicide having a higher concentration of germanium than the capping layer;
   a dielectric layer over the capping layer and around the gate stack; and
   a contact electrically connected to the silicide, wherein the silicide extends along and is physically separated from a side surface of the contact.

16. The semiconductor device of claim 15, wherein the capping layer has a lower germanium percentage than the epitaxial region.

17. The semiconductor device of claim 16, wherein the capping layer is free of germanium.

18. The semiconductor device of claim 15, wherein the capping layer comprises silicon germanium.

19. The semiconductor device of claim 15, wherein the epitaxial region and the capping layer each comprise p-type impurities.

20. The semiconductor device of claim 15, wherein a germanium concentration of the silicide is greater than a silicon concentration of the silicide.

* * * * *